United States Patent [19]

Minchey

[11] 4,398,098

[45] Aug. 9, 1983

[54] ELECTRONIC LATCHING CIRCUIT

[75] Inventor: Jerry M. Minchey, Leesville, S.C.

[73] Assignee: NCR Corporation, Dayton, Ohio

[21] Appl. No.: 371,912

[22] Filed: Apr. 26, 1982

[51] Int. Cl.³ .......................................... H01H 47/00
[52] U.S. Cl. ....................................... 307/140; 307/66
[58] Field of Search .................... 307/46, 48, 66, 140; 272/72 R

[56] References Cited

U.S. PATENT DOCUMENTS

| | | | |
|---|---|---|---|
| 1,393,940 | 10/1921 | Bliss | 307/48 |
| 3,308,306 | 3/1967 | Bagno | 307/48 X |
| 3,356,857 | 12/1967 | Strasen et al. | 307/48 X |
| 3,390,307 | 6/1968 | Paddison et al. | 307/66 X |
| 3,596,106 | 7/1971 | Raddi | 307/66 |
| 3,599,073 | 8/1971 | Wilson | 307/66 X |
| 4,044,268 | 8/1977 | Hammel et al. | 307/66 |
| 4,209,710 | 6/1980 | Quarton | 307/66 |

Primary Examiner—Michael L. Gellner
Assistant Examiner—Derek Jennings
Attorney, Agent, or Firm—J. T. Cavender; Edward Dugas

[57] ABSTRACT

An electronic latching circuit is described for incorporation into an electronic equipment which includes a battery, a load and a power supply. During shipment or storage of the equipment, the electronic latching circuit electrically isolates the battery from the load. The first time that the equipment is put into operation and turned on after shipment or storage, the electronic latching circuit automatically permanently connects the battery to the load. Once connected to the load the battery remains connected to the load, even when the equipment has a power failure, the power supply fails or the equipment is turned off. In a preferred embodiment the electronic latching circuit comprises: switching means for electrically isolating the battery from the load when the switching means is disabled and for connecting the battery to the load when the switching means is enabled; and input means connected to the battery and to the switching means for disabling the switching means until the power supply is initially energized and being responsive to the initial energization of the power supply for permanently enabling the switching means to connect the battery to the load.

8 Claims, 1 Drawing Figure

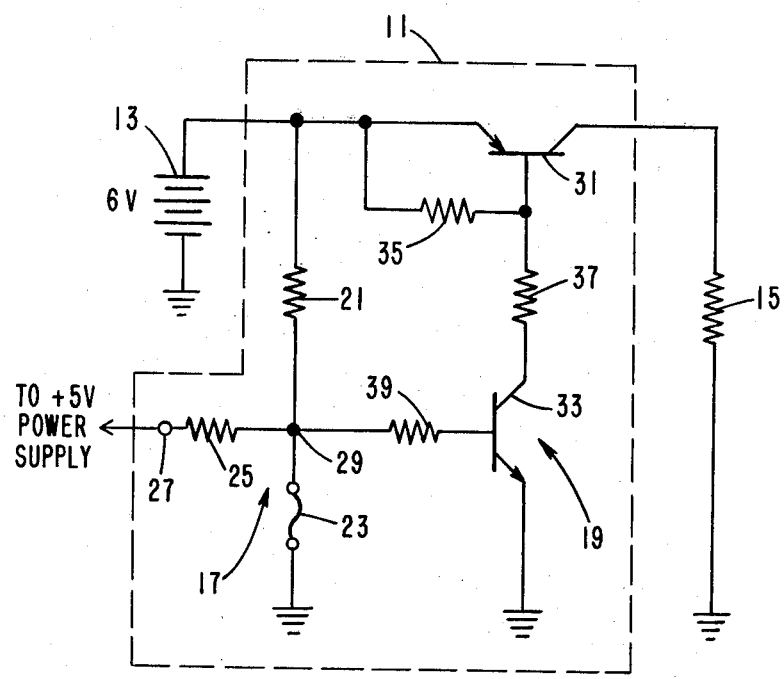

ELECTRONIC LATCHING CIRCUIT

BACKGROUND OF THE INVENTION

1. Field of the Invention

This invention relates to load switching circuits and particularly to an electronic simulation of a latching relay.

2. Description of the Prior Art

Many different prior art apparatuses or systems have been proposed for automatically switching a load to a standby power source upon the occurrence of some operating condition. Generally, each of such load-switching apparatuses automatically switches a load from a primary power supply to a standby or emergency power supply when the primary power supply has totally or partially failed and automatically switches the load back to the primary power supply when the primary power supply has been fully restored.

In a first type of load-switching apparatus the standby power supply is a battery which is not utilized to supply current to the load until there is a primary power failure. Thus, there are two separate power supplies, electrically-isolated from each other, which selectively supply energy to the load at different times, but not both at the same time. Examples of this first type of apparatus are described in U.S. Pat. Nos.: 3,308,306; 3,356,857; 3,390,307; 3,596,106; 4,044,268; and 4,209,710.

In a second type of load-switching apparatus a standby battery is connected across the load at all times to cooperate with a primary DC energy source in meeting the current demands of the load. During normal operation the primary DC energy source supplies current to the load, as well as a charging current to the battery when the battery charge level is low. Upon failure of the DC energy source, the battery alone supplies current to the load. Upon restoration of the DC energy source, normal operation is resumed. Examples of this second type of apparatus are described in U.S. Pat. Nos. 1,393,940 and 3,599,073.

In all of the above-described apparatuses, the switching of the load from a primary power supply to a standby power supply during a primary power loss and back to the primary power supply after the primary power is restored can be repeated each time that the primary power is lost and then restored. None of the above-described apparatuses teaches or suggests an electronic latching circuit which electrically isolates the battery from the load in an electronic equipment during the time that the equipment is being shipped or stored and automatically permanently switches or connects the battery to the load the first time that the equipment is put into operation and turned on after its shipment or storage.

SUMMARY OF THE INVENTION

Briefly, a novel electronic latching circuit is provided for use in an electronic equipment to electrically isolate a battery from a load until the equipment is first put into operation and turned on, at which time the battery is automatically and permanently connected to the load. In a preferred embodiment the electronic latching circuit includes a switching circuit connected between the battery and the load and an input circuit connected to the battery and the switching circuit. Until the electronic equipment is initially energized, the input circuit keeps the switching circuit disabled. While disabled, the switching circuit electrically isolates the battery from the load. When the electronic equipment is initially energized, a power supply voltage in the equipment causes the input circuit to permanently enable the switching circuit to connect the battery to the load.

It is, therefore, an object of this invention to provide a novel, simple, low cost electronic circuit that simulates the operation of a latching relay.

Another object of this invention is to provide, in an electronic equipment, an electronic circuit which automatically and permanently connects a battery to a load when the equipment is first put into operation and turned on.

BRIEF DESCRIPTION OF THE DRAWING

These and other objects, features and advantages of the invention, as well as the invention itself, will become more apparent to those skilled in the art in the light of the following detailed description taken in consideration with the accompanying drawing wherein:

The sole FIGURE illustrates a schematic circuit diagram of the preferred embodiment of the invention.

DESCRIPTION OF THE PREFERRED EMBODIMENT

Referring now to the drawing, there is shown an electronic latching circuit 11, in accordance with the invention, which is coupled between the positive terminal of a six volt (6 V) battery 13 and the upper side of a load 15 which is represented by a resistor. The electronic latching circuit 11 includes an input circuit 17 and a switching circuit 19 which has its operation controlled by the input circuit 17.

The input circuit 17 includes a 100 thousand (100K) ohm resistor 21 and a one-fourth ampere fuse 23 connected in series across the positive and negative terminals of the battery 13. The negative terminal of the battery 13, the lower side of fuse 23 and the lower side of load 15 are connected to a reference potential such as ground. Also included in the input circuit 17 is a 5 ohm resistor 25 connected between a terminal 27 and the common junction 29 of the serially-connected resistor 21 and fuse 23.

The switching circuit 19 includes a PNP transistor 31, an NPN transistor 33, a 10K ohm resistor 35, a 470 ohm resistor 37 and a 1K ohm resistor 39. The emitter and collector of transistor 31 are respectively connected between the positive terminal of battery 13 and the upper side of load 15. Resistor 35 is connected between the base and emitter of transistor 31. Resistor 37 is connected between the collector of transistor 33 and the base of transistor 31. The emitter of transistor 33 is connected to the reference potential or ground. Resistor 39 is connected between the common junction 29 and the base of transistor 33.

It should be noted at this time that the electronic latching circuit 11, battery 13, and load 15 are all contained within an electronic equipment (not shown) which may be shipped to a customer and/or stored for future use. The electronic equipment may include other electronic and mechanical components (not shown) including, for example, a positive five volt (+5 V) power supply (not shown) whose +5 V output is connected to the terminal 27. Electronic latching circuit 11 is designed into the equipment to electrically isolate the battery 13 from the load 15 until the equipment is first or initially put into operation and turned on after shipment or storage. At the time that the equipment is first or initially put into operation and turned on, the circuit 11 will automatically and permanently connect the battery 13 to the load 15. Such operation of the circuit 11 will now be explained in detail.

During the shipment or storage of the electronic equipment, no external power is applied to the equipment. Hence, there is no +5 V developed by the power supply and applied to terminal 27. Thus, during this time a very small amount of current (approximately 0.06 milliamperes) flows from the positive terminal of the battery 13 through resistor 21 and fuse 23 to ground. As a result, the common junction 29 is held at ground potential (0 V) by the fuse 23, thereby keeping transistor 33 turned off. With transistor 33 turned off, transistor 31 is also turned off since it has no base current when transistor 33 is not conducting. Resistor 35 prevents transistor 31 from being turned on by leakage current caused by high temperature. The non conduction of transistor 31 keeps the battery electrically isolated or disconnected from the load 15.

When, after shipment or storage, external power is initially applied to the electronic equipment and the equipment is turned on, the +5 V power supply becomes initially energized and feeds its +5 V output to the terminal 27. Current then flows from the +5 V at terminal 27 through the resistor 25 and the one-quarter ampere fuse 23 to ground. Resistor 25 limits the current through the fuse 23 to approximately 1 ampere, and also prevents the power supply from latching off during turn on due to excessive current. This relatively large current blows fuse 23, causing the potential at the common junction 29 to rise to a higher level, thereby forward-biasing the base-emitter region of transistor 33. As a result, transistor 33 turns on. Resistor 39 limits the base drive to transistor 33 from the +5 V power supply. When transistor 33 turns on, current flows from the battery 13, through the emitter-base region of transistor 31, through resistor 37 and through the collector-emitter region of transistor 33 to ground. Thus, the conduction of transistor 33 will also turn on transistor 31. Resistor 37 limits the base drive supplied by transistor 33 to transistor 31. When transistor 31 turns on, current flows from the battery 13, through the emitter-collector region of transistor 33 and through the load 15 to ground. Thus, when the transistors 33 and 31 turn on, they automatically connect the battery 13 to the load 15.

Once the transistors 33 and 31 turn on, they will stay on. After the transistors 33 and 31 are turned on, even if the +5 V from the power supply is lost (due to power supply failure, failure of the external power being applied to the electronic equipment or equipment shutdown), the transistors 33 and 31 will stay on and supply current from the battery 13 to the load 15 by way of the emitter-collector region of transistor 31. Consequently, the electronic latching circuit 11 is basically an electronic simulation of a latching relay.

The invention thus provides in the preferred embodiment an electronic circuit which is incorporated into an electronic equipment and which automatically and permanently connects a battery to a load when the equipment is first put into operation and turned on.

While the salient features of the invention have been illustrated and described, it should be readily apparent to those skilled in the art that many changes and modifications can be made in the electronic circuit of the invention presented without departing from the spirit and true scope of the invention. Accordingly, the present invention should be considered as encompassing all such changes and modifications of the invention that fall within the broad scope of the invention as defined by the appended claims.

I claim:

1. In an electronic equipment which includes a battery, a load and a power supply, an electronic latching circuit comprising:
    switching means for electrically isolating the battery from the load when said switching means is disabled and for connecting the battery to the load when said switching means is enabled; and
    input means connected to the battery and to said switching means for disabling said switching means until the power supply is initially energized and being responsive to the initial energization of the power supply for automatically permanently enabling said switching means to connect the battery to the load.

2. In an electronic equipment which includes a battery, a load and a power supply, an electronic latching circuit comprising:
    switching means connected between the battery and the load and being responsive to a first voltage level for electrically isolating the battery from the load and being responsive to a second voltage level for connecting the battery to the load; and
    input means connected to the battery and to said switching means for developing the first voltage level until the power supply is initially energized, said input means being responsive to the initial energization of the power supply for developing the second voltage level to automatically permanently enable said switching means to couple the battery to the load.

3. The electronic latching circuit of claim 2 wherein said switching means includes:
    an amplifying device having an input circuit connected to said input means and an output circuit serially connected between the battery and the load.

4. The electronic latching circuit of claim 3 wherein said input means includes:
    a first resistor; and
    a fuse serially-connected to said first resistor at a common junction to which the power supply and said input circuit are also coupled, said serially-connected first resistor and fuse being connected across the battery to enable the first voltage level to be developed at the common junction until the power supply is initially energized, said fuse being blown by current flow therethrough from the power supply when the power supply is initially energized to thereby cause the common junction to rise to the second voltage level to permanently enable said switching means to connect the battery to the load.

5. The electronic latching circuit of claim 2 wherein said switching means includes:
    first and second transistor circuits each having an input circuit and an output circuit, said input circuit of said first transistor circuit being connected to said input means, said output circuit of said first transistor circuit being connected to said input circuit of said second transistor circuit, said output circuit of said second transistor circuit being serially connected between the battery and the load.

6. The electronic latching circuit of claim 5 wherein said input means includes:

a first resistor; and a fuse serially-connected to said first resistor at a common junction to which the power supply and said input circuit of said first transistor circuit are also coupled, said serially-connected first resistor and fuse being connected across the battery to enable the first voltage level to be developed at the common junction until the power supply is initially energized, said fuse being blown by current flow therethrough from the power supply when the power supply is initially energized to thereby cause the common junction to rise to the second voltage level to permanently enable said switching means to couple the battery to the load.

7. The electronic latching circuit of claim 4 or 6 wherein said input means further includes a second resistor connected between the power supply and the common junction to limit the current through said fuse and to prevent the power supply from latching off during the initial energization of the power supply due to excess current.

8. In an electronic equipment which includes a battery, a load and a power supply, an electronic latching circuit comprising:

a switching circuit having an output circuit connected between the battery and the load and an input circuit, said switching circuit being responsive to a first voltage level applied to said input circuit for electrically isolating the battery from the load and to a second voltage level applied to said input circuit for connecting the battery to the load;

a common junction to which said input circuit is connected;

first and second resistors, said first resistor being connected between the power supply and said common junction;

a fuse serially-connected to said second resistor at said common junction, said serially-connected second resistor and fuse being connected across the battery to develop the first voltage level at said common junction until the power supply is initially energized, said fuse being blown by current flow therethrough from the power supply by way of said first resistor when the power supply is initially energized to thereby cause said common junction to rise to the second voltage level to automatically permanently enable said switching means to connect the battery to the load.

* * * * *